US012776366B2

(12) United States Patent
Ge et al.

(10) Patent No.: US 12,776,366 B2
(45) Date of Patent: Oct. 27, 2026

(54) CROSSBAR CIRCUITS INCLUDING RRAM DEVICES WITH MINIMIZED WRITE DISTURBANCES

(71) Applicant: TetraMem Inc., Fremont, CA (US)

(72) Inventors: Ning Ge, Danville, CA (US); Hengfang Zhu, Fremont, CA (US)

(73) Assignee: TetraMem Inc., San Jose, CA (US)

( * ) Notice: Subject to any disclaimer, the term of this patent is extended or adjusted under 35 U.S.C. 154(b) by 50 days.

(21) Appl. No.: 18/447,949

(22) Filed: Aug. 10, 2023

(65) Prior Publication Data

US 2025/0054541 A1 Feb. 13, 2025

(51) Int. Cl.
*G11C 13/00* (2006.01)

(52) U.S. Cl.
CPC ...... *G11C 13/0033* (2013.01); *G11C 13/0069* (2013.01); *G11C 2213/79* (2013.01)

(58) Field of Classification Search
CPC ............ G11C 13/0033; G11C 13/0069; G11C 2213/79; G11C 13/0028; G11C 13/003
See application file for complete search history.

(56) References Cited

U.S. PATENT DOCUMENTS 6,259,644 B1 * 7/2001 Tran ........................ G11C 11/15 365/158
2013/0134393 A1 5/2013 Bertin
2013/0329484 A1 * 12/2013 Tamai ................ G11C 13/0069 365/148
2017/0271003 A1 * 9/2017 Jeon ..................... G11C 13/004
2019/0027219 A1 * 1/2019 Nazarian ............ G11C 13/0097
2019/0198098 A1 * 6/2019 Yang .................... G11C 13/004
2019/0221261 A1 7/2019 Ge et al.
2021/0064979 A1 3/2021 Ido et al.
2022/0293173 A1 * 9/2022 Hu ...................... G06F 9/30101
2023/0044919 A1 * 2/2023 Li .......................... G06N 3/065
2023/0102234 A1 3/2023 Ge

FOREIGN PATENT DOCUMENTS

TW 200308077 12/2003
TW 200518337 A 6/2005
WO 2020068121 A1 4/2020

* cited by examiner

*Primary Examiner* — Jerome LeBoeuf
(74) *Attorney, Agent, or Firm* — Jaffery Watson Hamilton & DeSanctis LLP

(57) ABSTRACT

The present disclosure provides for crossbar circuits with minimized write disturbance. A crossbar circuit may include a plurality of bit lines intersecting with a plurality of word lines, a plurality of cross-point devices, and one or more first capacitors operatively connected to the plurality of bit lines. Each of the plurality of cross-point devices is connected to at least one of the plurality of word lines and at least one of the plurality of bit lines. The crossbar circuit may further include one or more second capacitors operatively connected to the plurality of word lines. The crossbar circuit may further include a plurality of select lines and/or one or more third capacitors operatively connected to the select lines.

19 Claims, 11 Drawing Sheets

CROSSBAR CIRCUITS INCLUDING RRAM DEVICES WITH MINIMIZED WRITE DISTURBANCES

TECHNICAL FIELD

The implementations of the disclosure relate generally to electronic devices and, more specifically, to crossbar circuits including resistive random-access memory (RRAM or ReRAM) devices and schemes for minimizing write disturbances for the crossbar circuits.

BACKGROUND

A crossbar circuit may refer to a circuit structure with interconnecting electrically conductive lines sandwiching a memory element, such as a resistive switching material, at their intersections. The resistive switching material may include, for example, a memristor (also referred to as resistive random-access memory (RRAM or ReRAM)). Crossbar circuits may be used to implement in-memory computing applications, non-volatile solid-state memory, image processing applications, neural networks, etc.

SUMMARY

The following is a simplified summary of the disclosure to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

According to one or more aspects of the present disclosure, an apparatus is provided. The apparatus includes a plurality of bit lines intersecting with a plurality of word lines, a plurality of cross-point devices, and one or more first capacitors operatively connected to the plurality of bit lines. Each of the plurality of cross-point devices is connected to at least one of the plurality of word lines and at least one of the plurality of bit lines.

In some embodiments, the apparatus further includes a first plurality of switches, wherein the one or more first capacitors are operatively connected to the plurality of bit lines via the first plurality of switches.

In some embodiments the one or more first capacitors are operatively connected to each of the plurality of bit lines via a respective switch of the first plurality of switches.

In some embodiments, the apparatus further includes one or more second capacitors operatively connected to the plurality of word lines.

In some embodiments, the apparatus further includes a second plurality of switches, wherein the one or more second capacitors are operatively connected to the plurality of word lines via the second plurality of switches.

In some embodiments, the plurality of cross-point devices includes at least one of a memristor, a phase-change memory (PCM) device, a floating gate device, a spintronic device, a ferroelectric device, or a resistive random-access memory (RRAM) device.

In some embodiments, the apparatus further includes a plurality of select lines connected to the plurality of cross-point devices.

In some embodiments, the plurality of cross-point devices includes at least one transistor that connects to at least one select line of the plurality of select lines.

In some embodiments, the apparatus further includes one or more third capacitors operatively connected to the plurality of select lines.

In some embodiments, the apparatus further includes a third plurality of switches. The one or more third capacitors are operatively connected to each of the plurality of select lines via a respective switch of the third plurality of switches In some embodiments, the plurality of select lines is parallel to the plurality of word lines.

In some embodiments, the plurality of select lines is parallel to the plurality of bit lines.

According to one or more aspects of the present disclosure, a method for programming a crossbar circuit is provided. The method includes connecting one or more first capacitors of the crossbar circuit to a first bit line of a plurality of bit lines and applying a programming voltage to a first word line of a plurality of word lines or the first bit line. The plurality of bit lines intersects with the plurality of word lines. The crossbar circuit includes a plurality of cross-point devices, wherein each of the plurality of cross-point devices is connected to at least one of the word lines and at least one of the bit lines. A first cross-point device of the plurality of cross-point devices is connected to the first word line and the first bit line.

In some embodiments, the method further includes resetting the one or more first capacitors of the crossbar circuit to ground before connecting the one or more first capacitors to the first bit line of the crossbar circuit.

In some embodiments, the method further includes connecting one or more second capacitors of the crossbar circuit to a first word line of the crossbar circuit prior to the application of the programming voltage to the first word line or the first bit line.

In some embodiments, the method further includes resetting the one or more second capacitors of the crossbar circuit to ground before connecting the one or more second capacitors to the first word line of the crossbar circuit.

In some embodiments, the method further includes connecting one or more third capacitors of the crossbar circuit to a select line of the crossbar circuit prior to the application of the programming voltage to the first word line or the first bit line.

In some embodiments, the method further includes resetting the one or more third capacitors of the crossbar circuit to ground before connecting the one or more third capacitors to the first select line of the crossbar circuit.

In some embodiments, the method further includes applying a select voltage to a first select line connected to the first cross-point device.

In some embodiments, the programming voltage is applied to the first word line, wherein the first bit line is grounded, wherein a second bit line of the crossbar circuit is set to float, and wherein a second cross-point device of the crossbar circuit is connected to the first word line, the second bit line, and the first select line.

In some embodiments, the programming voltage is applied to the first bit line, wherein the first word line is grounded, wherein a second word line is set to float, and wherein a third cross-point device of the crossbar circuit is connected to the second word line, the first bit line, and a second select line.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding.

DETAILED DESCRIPTION

Figure 1:
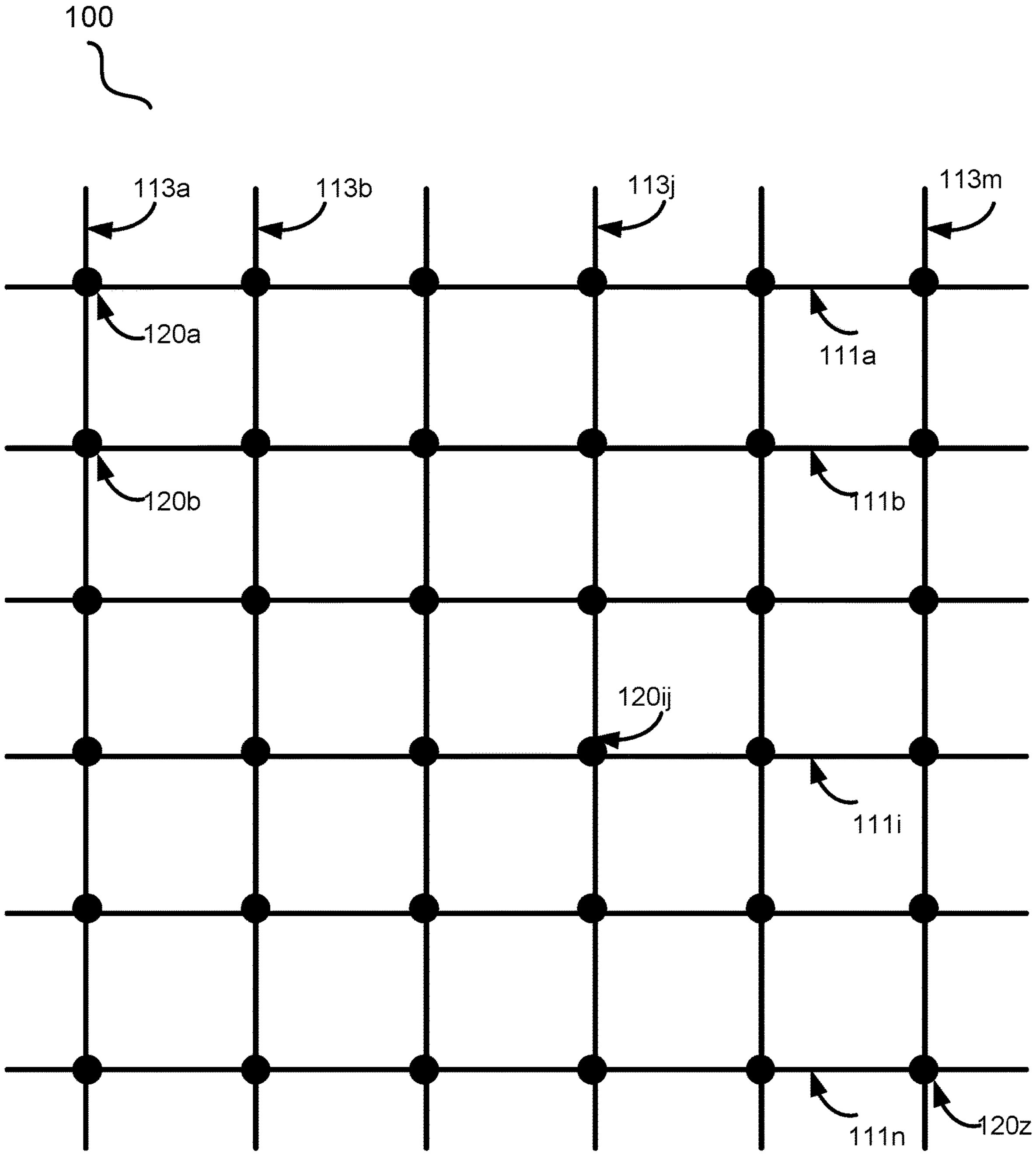
FIG. 1 is a schematic diagram illustrating an example crossbar circuit in accordance with some embodiments of the present disclosure.

Aspects of the disclosure provide crossbar circuits with minimized write disturbances. A crossbar circuit may include intersecting electrically conductive wires (e.g., row lines, column lines, etc.) and cross-point devices arranged in one or more arrays. Each of the cross-point devices may be connected to a word line, a bit line, and a select line. The cross-point devices may include, for example, a phase-change memory (PCM) device, a floating gate device, a spintronic device, a ferroelectric device, a resistive random-access memory (RRAM) device, etc.

Write disturbances may occur in a crossbar circuit when the programming of a selected cross-point device inadvertently affects the resistance state of another unselected cross-point device. After achieving and maintaining the target conductance within an acceptable limit for several cycles in certain RRAM devices in the crossbar circuit, unexpected conductance shifts can occur due to the programming of other memristors in the same array. Such disturbance of the originally programmed RRAM devices may necessitate a restart of a programming process, consequently extending the overall programming time required to program the crossbar circuit. In some cases, it may be impossible to program each of the RRAM devices in the array to its target conductance, thereby undermining the overall efficiency and functionality of the crossbar circuit. The write disturbance is primarily caused by the parasitic capacitance of the crossbar circuit. The parasitic capacitance can affect the voltage difference across RRAM devices that are not selected for programming, causing these unselected RRAM devices to change their resistance state unintentionally.

The present disclosure provides mechanisms for minimizing write disturbance in crossbar circuits. In accordance with one or more aspects of the present disclosure, a crossbar circuit may include one or more first capacitors operatively connected to the bit lines, one or more second capacitors operatively connected to the word lines of the crossbar circuit, and/or one or more third capacitors operatively connected to the select lines. The capacitance of the first capacitor(s), the capacitance of the second capacitor(s), and the capacitance of the third capacitor(s) may be significantly greater (e.g., 100 times greater) than the parasitic capacitance of the crossbar circuit. Prior to programming the conductance of a target cross-point device to a target conductance value, the first capacitors, the second capacitors, and the third capacitors may be reset to ground. The first capacitors, the second capacitors, and the third capacitors may then be connected to a bit line, a word line, and a select line connected to the target cross-point device, respectively. A suitable programming voltage may then be applied to the word line and the bit line, respectively. The word line and the bit line may be brought down to ground at the end of the programming cycle. When the crossbar circuit is performing in-memory computing, the first capacitors are disconnected from the bit lines, and the second capacitors are disconnected from the word lines.

Connecting additional capacitors to the bit lines, the word line, and/or the select line may slow down the voltage changes on the bit line, the word line, and/or the select line connected to the target cross-point device to be programmed, thereby allowing the voltage on the parasitic capacitors to synchronize with the bit line and word line voltage alterations. As a result, the voltage difference across the unselected RRAM devices may be maintained at a sufficiently low level to prevent unintentional programming of unselected RRAM devices.

FIG. 1 is a schematic diagram illustrating an example 100 of a crossbar circuit in accordance with some embodiments of the present disclosure. As shown, crossbar circuit 100 may include a plurality of interconnecting electrically conductive wires, such as one or more row wires 111$a$, 111$b$, . . . , 111$i$, . . . , 111$n$, and column wires 113$a$, 113$b$, . . . , 113$j$, . . . , 113$m$ for an n-row by m-column crossbar array. The crossbar circuit 100 may further include cross-point devices 120$a$, 120$b$, . . . , 120$z$, etc. Each of the cross-point devices may connect a row wire and a column wire. For example, the cross-point device 120$ij$ may connect the row wire 111$i$ and the column wire 113$j$. In some embodiments, crossbar circuit 100 may further include digital to analog converters (DACs, not shown), analog-to-digital converters (ADCs, not shown), switches (not shown), and/or any other suitable circuit components for implementing a crossbar-based apparatus. The number of the column wires 113$a$-$m$ and the number of the row wires 111$a$-$n$ may or may not be the same.

Row wires 111$a$-$n$ may include a first row wire 111$a$, a second row wire 111$b$, . . . , 111$i$, . . . , and an n-th row wire 111$n$. Each of row wires 111$a$, . . . , 111$n$ may be and/or include any suitable electrically conductive material. In some embodiments, each row wire 111$a$-$n$ may be a metal wire.

Column wires 113$a$-$m$ may include a first column wire 113$a$, a second column wire 113$b$, . . . , and an m-th column wire 113$m$. Each column wire 113$a$-$m$ may be and/or include any suitable electrically conductive material. In some embodiments, each column wire 113$a$-$m$ may be a metal wire.

Each cross-point device 120$a$-$z$ may be and/or include any suitable device with tunable resistance, such as a PCM (phase-change memory) device, a floating gate device, a spintronic device, a ferroelectric device, resistive random-access memory (RRAM), static random-access memory (SRAM), etc. In some embodiments, one or more of cross-point devices 120$a$-$z$ may include a cross-point device as described in connection with FIGS. 2A-2B.

Crossbar circuit 100 may perform parallel weighted voltage multiplication and current summation. For example, an input voltage signal may be applied to one or more rows of crossbar circuit 100 (e.g., one or more selected rows). The input signal may flow through the cross-point devices of the rows of the crossbar circuit 100. The conductance of the cross-point device may be programmed to a specific value (also referred to as a "weight"). By Ohm's law, the input voltage multiplies the cross-point conductance and generates a current from the cross-point device. By Kirchhoff's law, the summation of the current passing the devices on each column generates the current as the output signal, which may be read from the columns (e.g., outputs of the ADCs). According to Ohm's law and Kirchhoff's current law, the input-output relationship of the crossbar array can be represented as I=VG, wherein I represents the output signal matrix as current; V represents the input signal matrix as voltage; and G represents the conductance matrix of the cross-point devices. As such, the input signal is weighted at each of the cross-point devices by its conductance according to Ohm's law. The weighted current is output via each column wire and may be accumulated according to Kirchhoff's current law. This may enable in-memory computing (IMC) via parallel multiplications and summations performed in the crossbar arrays.

Figure 2A:
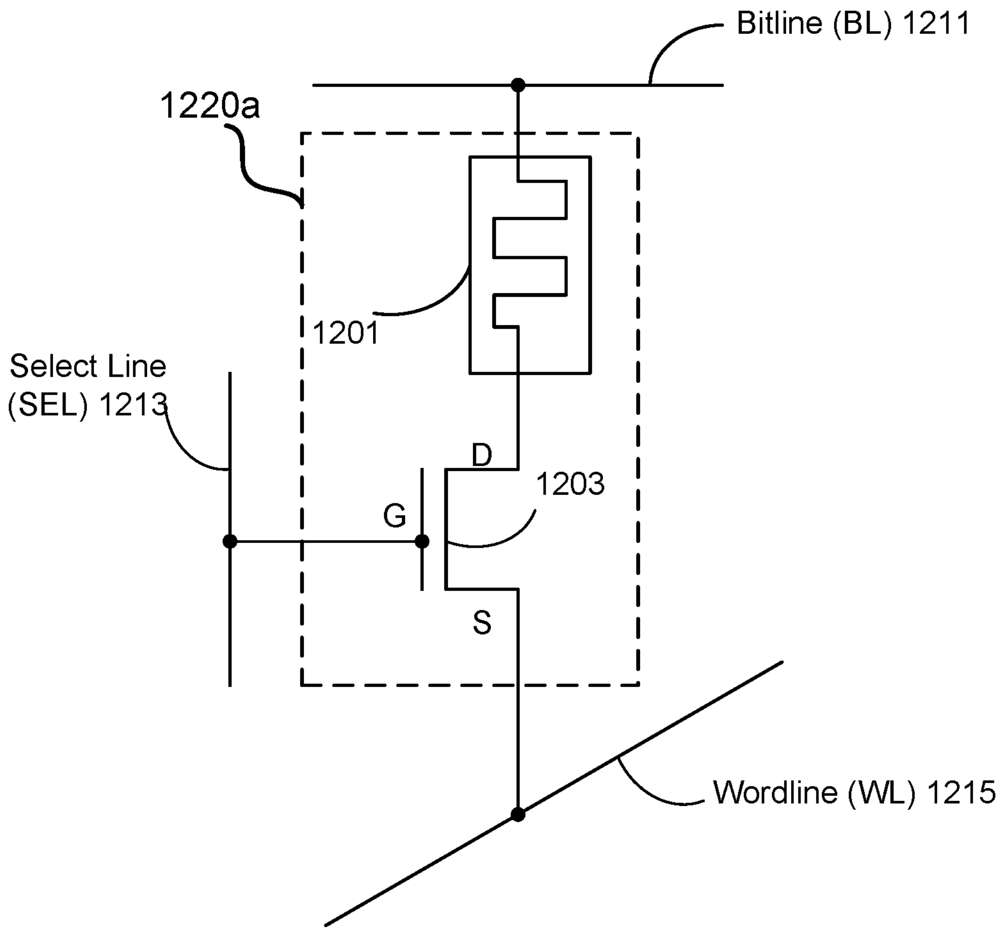
FIGS. 2A and 2B are schematic diagrams illustrating example cross-point devices in accordance with some embodiments of the present disclosure.
Figure 2B:
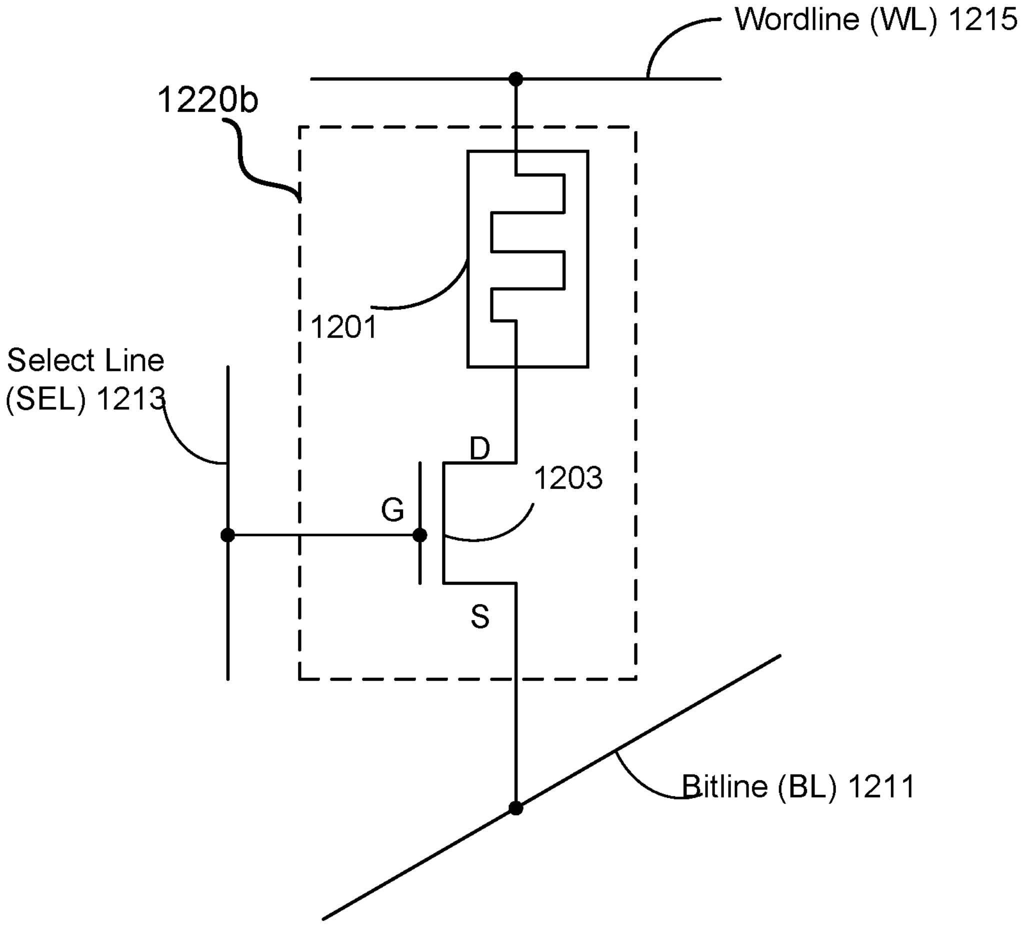

FIGS. 2A and 2B are schematic diagrams illustrating example cross-point devices 1220*a* and 1220*b* in accordance with some embodiments of the present disclosure. Cross-point device 1220*a* and cross-point device 1220*b* may be referred to as a 1-transistor-1-resistor (1T1R) configuration.

As shown in FIGS. 2A and 2B, a cross-point device 1220*a-b* may include an RRAM device 1201 and a transistor 1203 that are connected in series. A transistor may include three terminals that may be marked as gate (G), source(S), and drain (D), respectively. Referring to FIG. 2A, the first terminal of RRAM device 1201 may be connected to the drain of transistor 1203. A second terminal of RRAM device 1201 may be connected to a bit line 1211. The source of the transistor 1203 may be connected to a word line 1215. The gate of transistor 1203 may be connected to a select line 1213.

As shown in FIG. 2B, the second terminal of RRAM device 1201 may be connected to the word line 1215, and the source of the transistor 1203 may be connected to a bit line 1211 in some embodiments. Word line 1215 may correspond to a row wire 111*a-n* of FIG. 1. Bit line 1211 may correspond to a column wire 113*a-m* of FIG. 1.

Transistor 1203 may function as a selector as well as a current controller and may set the current compliance to RRAM device 1201 during programming. The gate voltage on transistor 1203 can set current compliance to cross-point device 1220*a-b* during programming and can thus control the conductance and analog behavior of cross-point device 1220*a-b*. For example, when cross-point device 1220*a-b* is set from a high-resistance state to a low-resistance state, a set signal (e.g., a voltage signal, a current signal) may be provided via bit line (BL) 1211 or word line (WL) 1215. Another voltage, also referred to as a select voltage or gate voltage, may be applied via select line (SEL) 1213 to the transistor gate to open the gate and set the current compliance, while word line (WL) 1215 or bit line (BL) 1211 may be grounded. When cross-point device 1220*a-b* is reset from the low-resistance state to the high-resistance state, a gate voltage may be applied to the gate of transistor 1203 via select line 1213 to open the transistor gate. Meanwhile, a reset signal may be sent to RRAM device 1201 via word line 1215 or bit line 1211, while bit line 1211 or word line 1215 may be grounded.

Figure 3A:
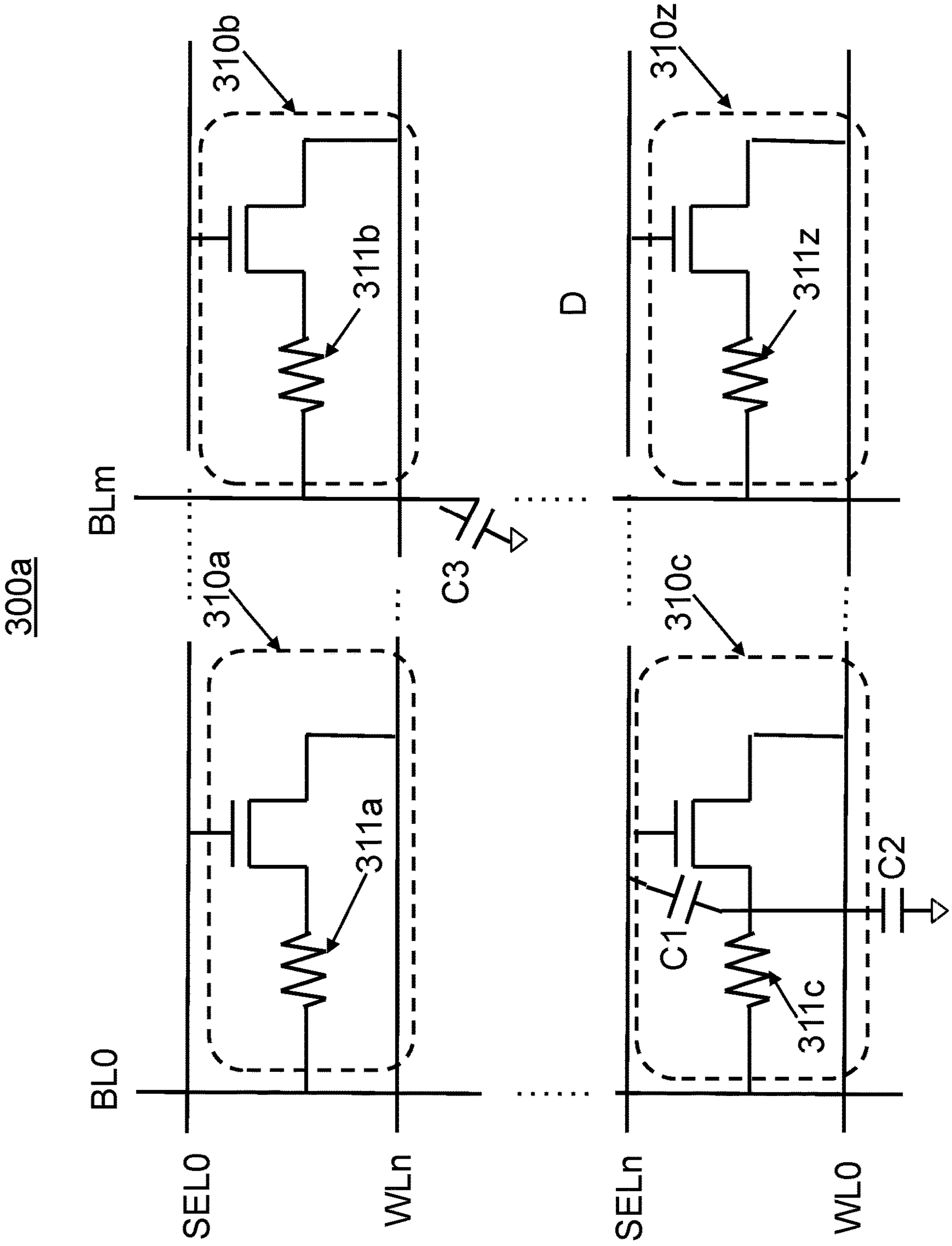
FIGS. 3A and 3B are schematic diagrams illustrating example disturbances that may occur in crossbar circuits.

FIG. 3A is a schematic diagram illustrating example disturbances that may occur in a crossbar circuit 300*a*. As shown, the crossbar circuit 300*a* may include cross-point devices 310*a*, 310*b*, 310*c*, . . . , 310*z*. Each of the cross-point devices may be connected to a word line WL0, . . . , WLn, a bit line BL0, . . . , BLm, and a select line SEL0, . . . , SELn. Each cross-point device 310*a*, 310*b*, 310*c*, . . . , 310*z* may include an RRAM device (e.g., RRAM device 311*a*, 311*b*, . . . , 311*z*). As shown in FIG. 3A, the word lines WL0, . . . , WLn may be parallel to the select lines SEL0, . . . , SELn.

During a form operation or a set operation that programs a cross-point device 310*a* and/or RRAM device 311*a*, the word line WLn may be grounded. A programming voltage may be applied to the bit line BL0. A select voltage may be applied to the select line SEL0. The select lines that are not connected to the cross-point device 310*a* (e.g., SELn) may be grounded. The bit lines and the word lines that are not connected to the cross-point device 310*a* (e.g., BLm, WL0, etc.) may be set to float. A disturbance may occur during the form operation or the set operation if the voltage across an unselected RRAM device exceeds a predefined amount within a certain time duration. For example, even though the word line WL0 is set to float, the RRAM device 311*c* may still be charged by BL0, because the RRAM device 311*c* shares the same bit line with the RRAM device 311*a*. If the bit line junction capacitance or other parasitic capacitance (e.g., C1 and C2 as shown in FIG. 3A) is large enough, the unselected RRAM device 311*c* may be unintendedly programmed and thus disturbed by the voltage build-up across it.

Write disturbance may also occur during a deform or reset process if the voltage across an unselected RRAM device exceeds a predefined amount of voltage during a certain time duration. For example, performing a deform operation or reset operation on the cross-point device 310*a* and/or the RRAM device 311*a* may involve applying a programming voltage to the word line WLn connected to the cross-point device 310*a*. The select voltage is applied to the select line SEL0 to enable the programming of the RRAM device 311*a*. The bit line BL0 is grounded. The word lines and the bit lines that are not connected to the cross-point device 310*a* may be set to float. However, an unselected RRAM device, such as the RRAM device 311*b*, may still be programmed and/or disturbed. Even though the bit line BLm connected to the unselected RRAM device is set to float, it may still be charged by the programming voltage applied to the word line WLn, because the RRAM devices 311*a* and 311*b* share the same word line WLn. If the bit line junction capacitance or other parasitic capacitance (e.g., C3 as shown in FIG. 3A) is large enough, the unselected RRAM device 311*b* may be unintendedly programmed and thus disturbed by the voltage buildup across it.

Figure 3B:
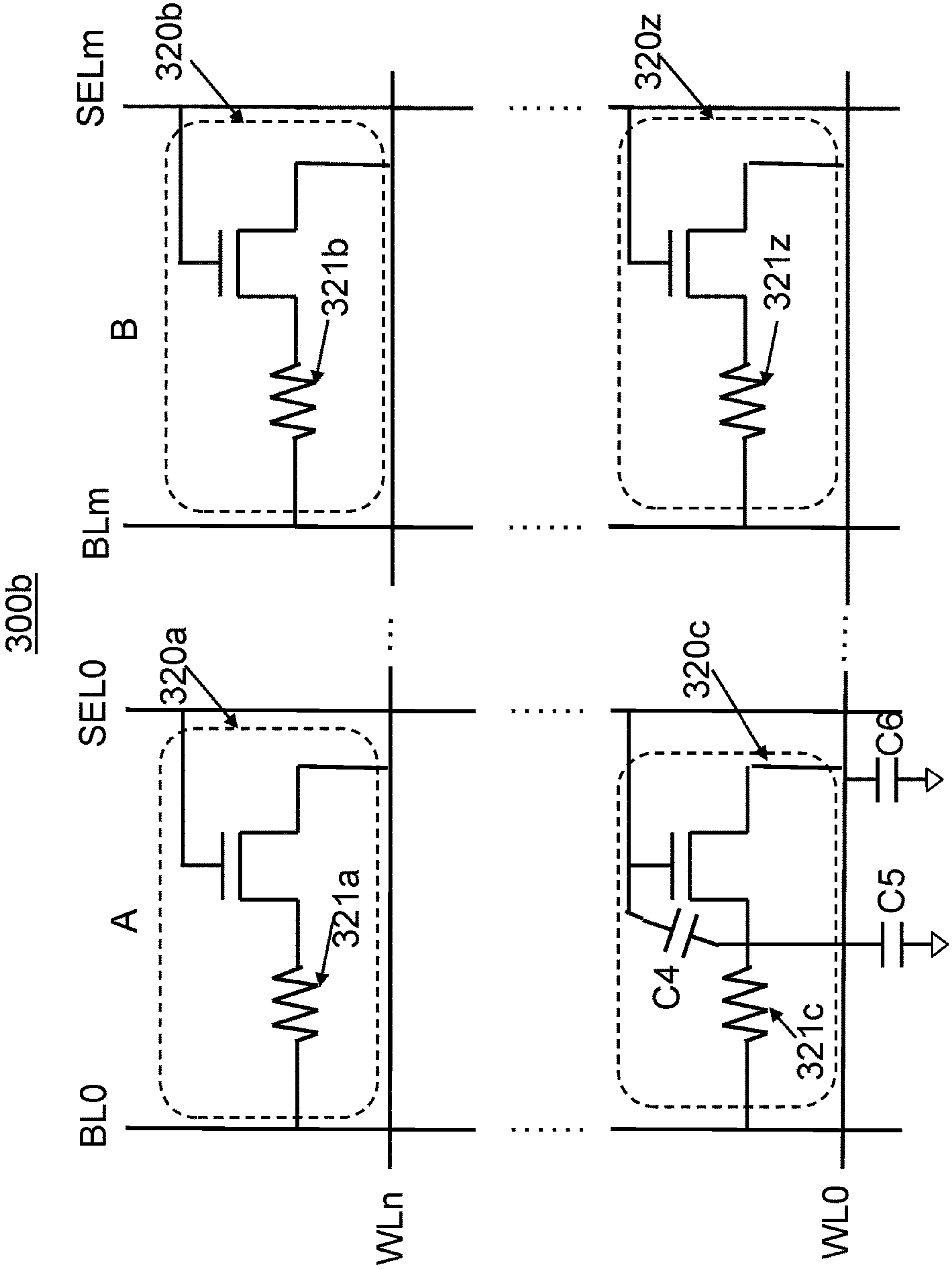

FIG. 3B is a schematic diagram illustrating example disturbances that may occur in a crossbar circuit 300*b*. As shown, the crossbar circuit 300*b* may include cross-point devices 320*a*, 320*b*, 320*c*, . . . , 320*z*. Each of the cross-point devices is connected to a word line WL0, . . . , WLn, a bit line BL0, . . . , BLm, and a select line SEL0, . . . , SELm. Each cross-point device 320*a*, 320*b*, 320*c* . . . , 320*z* may include an RRAM device (e.g., RRAM device 321*a*, 321*b*, . . . , 321*z*). As shown in FIG. 3B, the bit lines BL0, . . . , BLm may be parallel to the select lines SEL0, . . . , SELm.

During a form operation or a set operation that programs a cross-point device 320*a* and/or RRAM device 321*a*, the word line WLn may be grounded. A programming voltage may be applied to the bit line BL0. A select voltage may be applied to the select line SEL0. The select lines that are not connected to the cross-point device 320_a_ (e.g., SELm) may be grounded. The bit lines and the word lines that are not connected to the cross-point device 320_a_ (e.g., BLm, WL0, etc.) may be set to float. A disturbance may occur during the form operation or the set operation if the voltage across an unselected RRAM device exceeds a predefined amount within a certain time duration. Even though the word line WL0 is floated, the RRAM device 321_c_ may still be charged by BL0 or SEL0 because the RRAM device 321_c_ shares the same bit line and select line with the RRAM device 321_a_. If the bit line parasitic capacitor or other parasitic capacitors (e.g., C4, C5, and C6 as shown in FIG. 3B) are large enough, the unselected RRAM device 321_c_ may be unintendedly programmed and thus disturbed by the voltage build-up across it.

A disturbance may also occur during a deform or reset process if the voltage across an unselected RRAM device exceeds a predefined amount of voltage during a certain time duration. For example, performing a deform operation or reset operation on the cross-point device 320_a_ and/or the RRAM device 321_a_ may involve applying a programming voltage to the word line WLn connected to the cross-point device 320_a_. The select voltage is applied to the select line SEL0 to enable the programming of the RRAM device 321_a_. The bit line BL0 is grounded. The word lines and the bit lines that are not connected to the cross-point device 320_a_ may be set to float. However, an unselected RRAM device, such as the RRAM device 321_c_, may still be programmed and/or disturbed, because the RRAM devices 321_a_ and 321_c_ share the same select line SEL0. If the parasitic capacitor is large enough, the unselected RRAM device 321_c_ may be unintendedly programmed and thus disturbed by the voltage buildup across it.

Figure 4A:
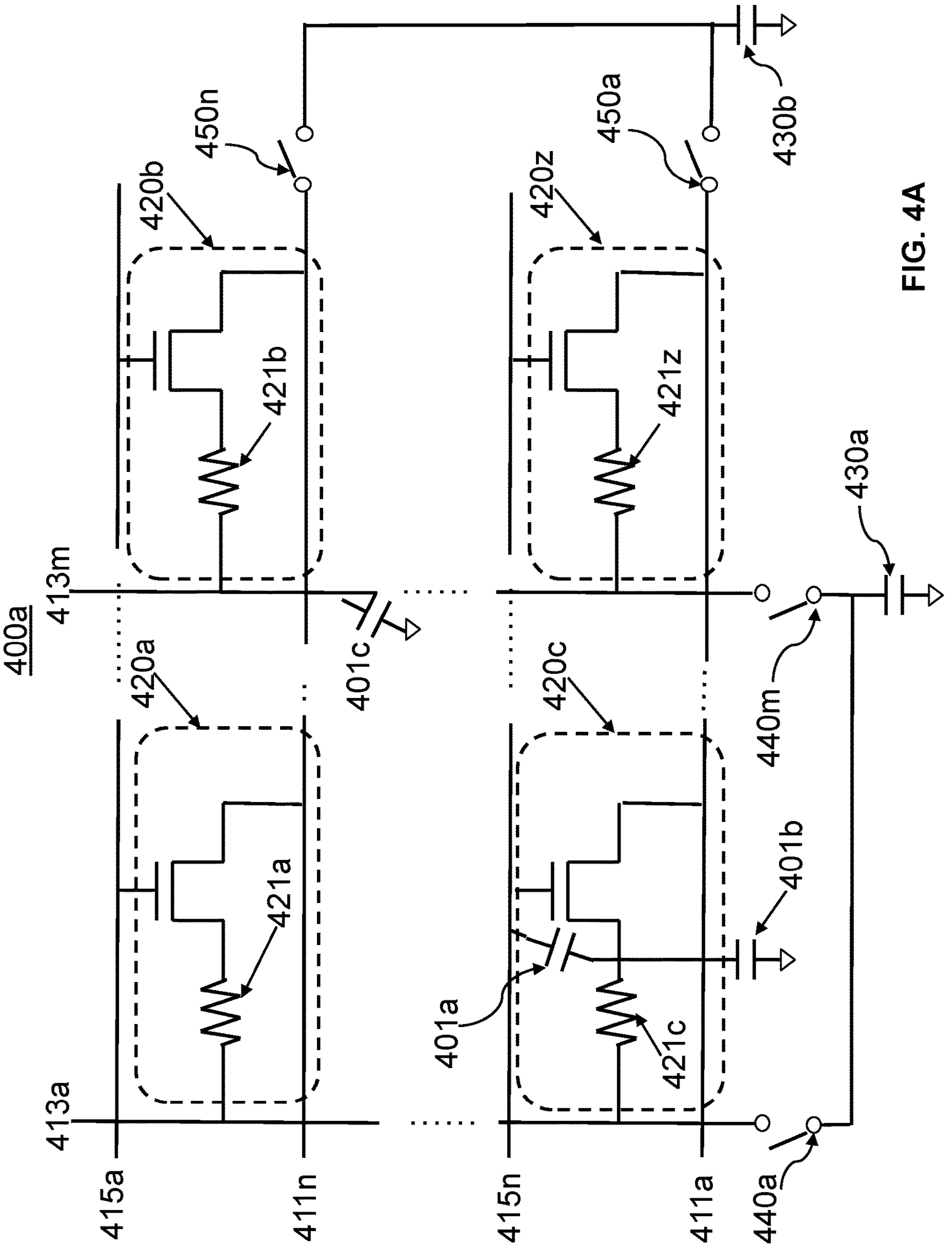
FIGS. 4A and 4B are schematic diagrams illustrating example crossbar circuits in accordance with one implementation of the present disclosure.
Figure 4B:
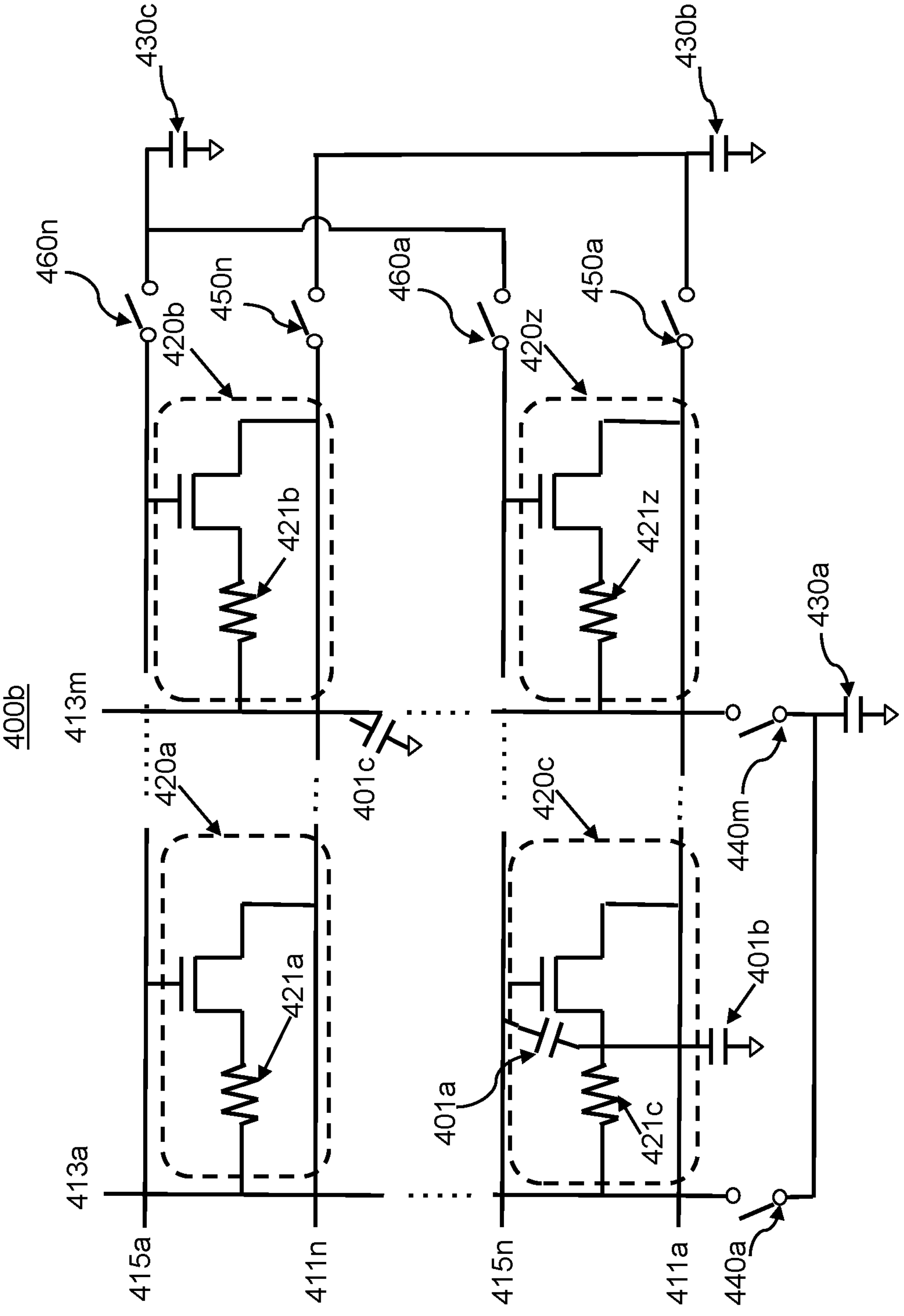

FIGS. 4A and 4B are schematic diagrams illustrating examples 400_a_ and 400_b_ of a crossbar circuit in accordance with some embodiments of the present disclosure. Crossbar circuits 400_a_ and 400_b_ are examples of a portion of crossbar circuit 100 of FIG. 1 in greater detail.

Crossbar circuit 400_a_ and crossbar circuit 400_b_ may include word lines 411_a_, . . . , 411_n_, bit lines 413_a_, . . . , 413_m_, cross-point devices 420_a_, 420_b_, 420_c_, . . . , 420_z_, and select lines 415_a_, . . . , 415_n_. Word lines 411_a-n_ and bit lines 413_a-m_ may be the same as row lines 111_a-n_ and column lines 113_a-m_ of FIG. 1, respectively. As shown in FIGS. 4A-4B, select lines 415_a-n_ may be parallel to word lines 411_a-n_.

As shown, each cross-point device 420_a_, 420_b_, . . . , 420_z_ may be connected to a bit line 413_a-m_, a select line 415_a-n_, and a word line 411_a-n_. In some embodiments, each cross-point device 420_a-z_ may include a transistor and an RRAM device (e.g., RRAM devices 421_a_, 421_b_, 421_c_, . . . , 421_z_) connected in series (e.g., a 1T1R configuration described in connection with FIG. 2A or FIG. 2B). For example, the RRAM device may be connected to a bit line and the drain or source of the transistor. The gate of the transistor may be connected to a select line 415_a-n_.

The crossbar circuit 400_a_ may further include one or more capacitors 430_a_ (also referred to as the "first capacitors") that may be operatively connected to bit lines 413_a-m_. For example, each bit line 413_a_, . . . , 413_m_ may be connected to the capacitor 430_a_ via a switch (e.g., a switch 440_a_, . . . , 440_m_). The capacitance of the capacitor(s) 430_a_ may be significantly greater than (e.g., at least 100 times greater than) the parasitic capacitance of the crossbar circuit 400_a_ (e.g., parasitic capacitance 401_a_, 401_b_, 401_c_, etc.).

The crossbar circuit 400_a_ may further include one or more capacitors 430_b_ (also referred to as the "second capacitors") that may be operatively connected to word lines 411_a-n_. For example, each word line 411_a-n_ may be connected to the capacitor(s) 430_b_ via a respective switch 450_a_, . . . , 450_n_. The capacitance of the capacitor(s) 430_b_ may be significantly greater than the parasitic capacitance of the crossbar circuit 400_a_.

In some embodiments, as shown in FIG. 4B, the crossbar circuit may further include one or more capacitors 430_c_ (also referred to as the "third capacitors") that may be operatively connected to select lines 415_a-n_. For example, each select line 415_a-n_ may be connected to the capacitor(s) 430_c_ via a respective switch 460_a_, . . . , 460_n_. The capacitance of the capacitor(s) 430_c_ may be significantly greater than the parasitic capacitance of the crossbar circuit 400_b_.

While one capacitor 430_a_, one capacitor 430_b_, and one capacitor 430_c_ are shown in FIGS. 4A-4B, this is merely illustrative. Any suitable number of capacitors may be used, and the capacitors may be connected in any suitable manner to achieve an additional capacitance that is significantly greater than the parasitic capacitance of the crossbar circuit 400_a-b_.

Prior to a programming operation (e.g., a set operation, a form operation, a reset operation, a deform operation), the capacitors 430_a_, 430_b_ and 430_c_ may be reset to ground. To initiate a programming operation and/or program a target cross-point device to a target conductance value, the capacitors 430_a_, 430_b_, and 430_c_ may be connected to a bit line connected to the target cross-point device (also referred to as the "selected bit line"), a word line connected to the target cross-point device (also referred to as the "selected word line"), and a select line connected to the target cross-point device, respectively. A first programming voltage and a second programming voltage may then be applied to the selected word line and the selected bit line, respectively. The selected word line and the selected bit line may be brought down to ground at the end of the programming cycle. When the crossbar circuit 400_a-b_ is performing in-memory computing (e.g., performing a VMM operation), the capacitors 430_a_ are disconnected from the bit lines 413_a-m_, and the capacitors 430_b_ are disconnected from the word lines 411_a-n_. The capacitors 430_c_ are also disconnected from the select lines 415_a-n_ during in-memory computing operations.

Connecting additional capacitors 430_a-c_ to the bit line, the word line, and the select line may thus slow down the voltage changes on the selected bit line and the selected word line, thereby allowing the voltage on the parasitic capacitors to synchronize with the bit line and word line voltage alterations. As a result, the voltage difference across the unselected RRAM devices may be maintained at a sufficiently low level to prevent unintentional programming of unselected RRAM devices.

For example, the capacitors 430_a_, 430_b_, and 430_c_ may be reset to ground prior to performing a programming operation on the cross-point device 420_a_ and/or the RRAM device 421_a_. The capacitor 430_a_ may then be connected to the bit line 413_a_ via the switch 440_a_. The capacitor 430_b_ may be connected to the word line 411_n_ via the switch 450_n_. The capacitor 430_c_ may be connected to the select line 415_n_ via the switch 460_n_. A select voltage may be applied to the select line 415_a_ to select the cross-point device 420_a_ and/or the RRAM device 421_a_ for programming. The select lines that are not connected to the cross-point device 420_a_ (e.g., select line 415_n_) may be grounded. During a form operation or a set operation, the word line 411_n_ may be grounded. A programming voltage may be applied to the bit line 413_a_. The bit lines and the word lines that are not connected to the cross-point device 420_a_ (e.g., the bit line 413_m_, the word line 411a, etc.) may be set to float. During a deform operation or reset operation on the cross-point device 420a and/or the RRAM device 421a, a programming voltage may be applied to the word line 411n connected to the cross-point device 420a. The bit line 413a is grounded. The word lines and the bit lines that are not connected to the cross-point device 420a may be set to float.

The capacitor 430a may slow down the ramping speed of the bit line voltage. The capacitor 430b may slow down the ramping speed of the word line voltage. The capacitor 430c may slow down the ramping speed of the select line voltage. As a result, the voltage difference across the unselected RRAM devices (e.g., RRAM device 421b, 421c, etc.) during the programming of the RRAM device 421a may not trigger the programming of the unselected RRAM devices.

Figure 5A:
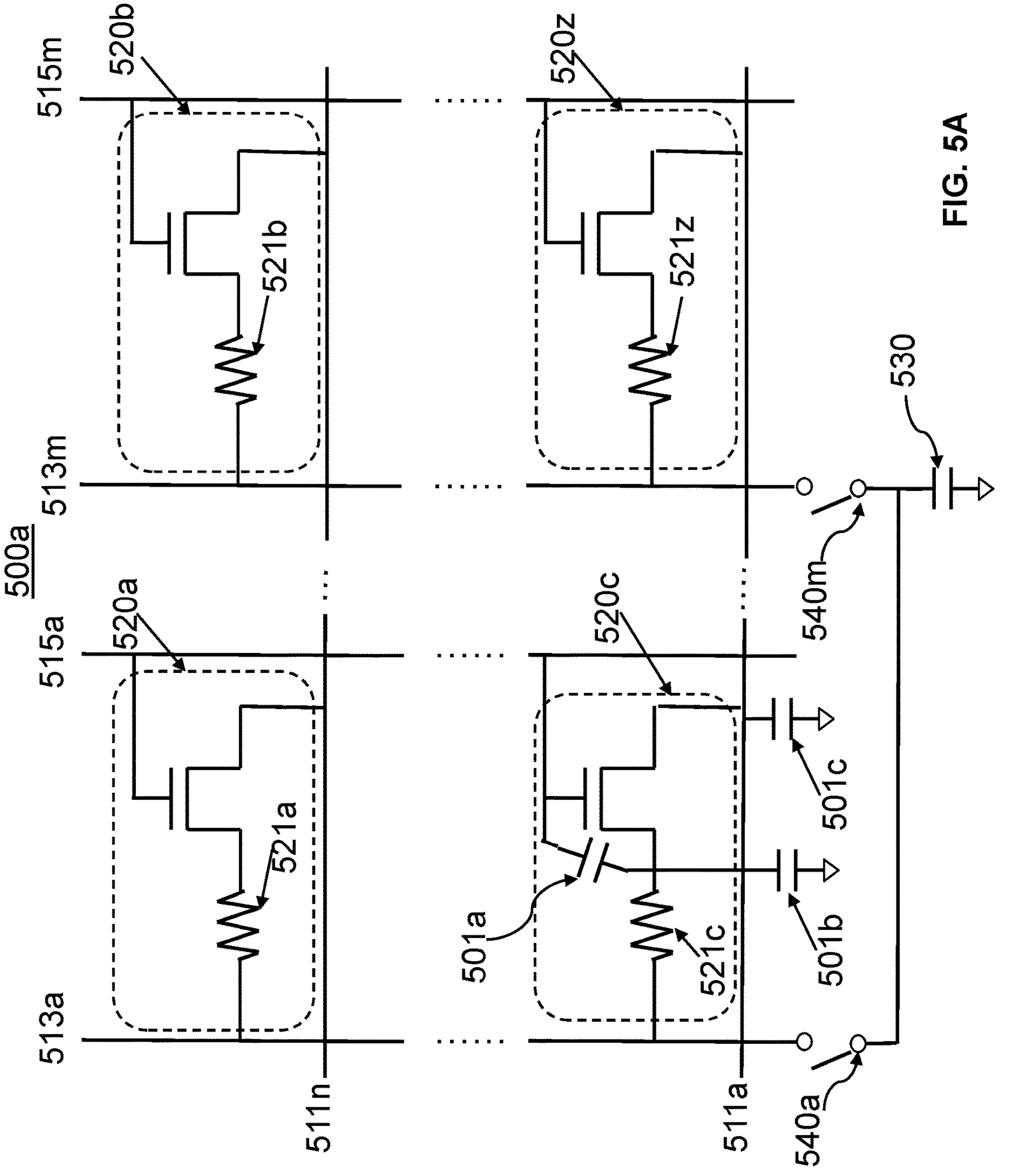
FIGS. 5A and 5B are schematic diagrams illustrating example crossbar circuits in accordance with another implementation of the present disclosure.
Figure 5B:
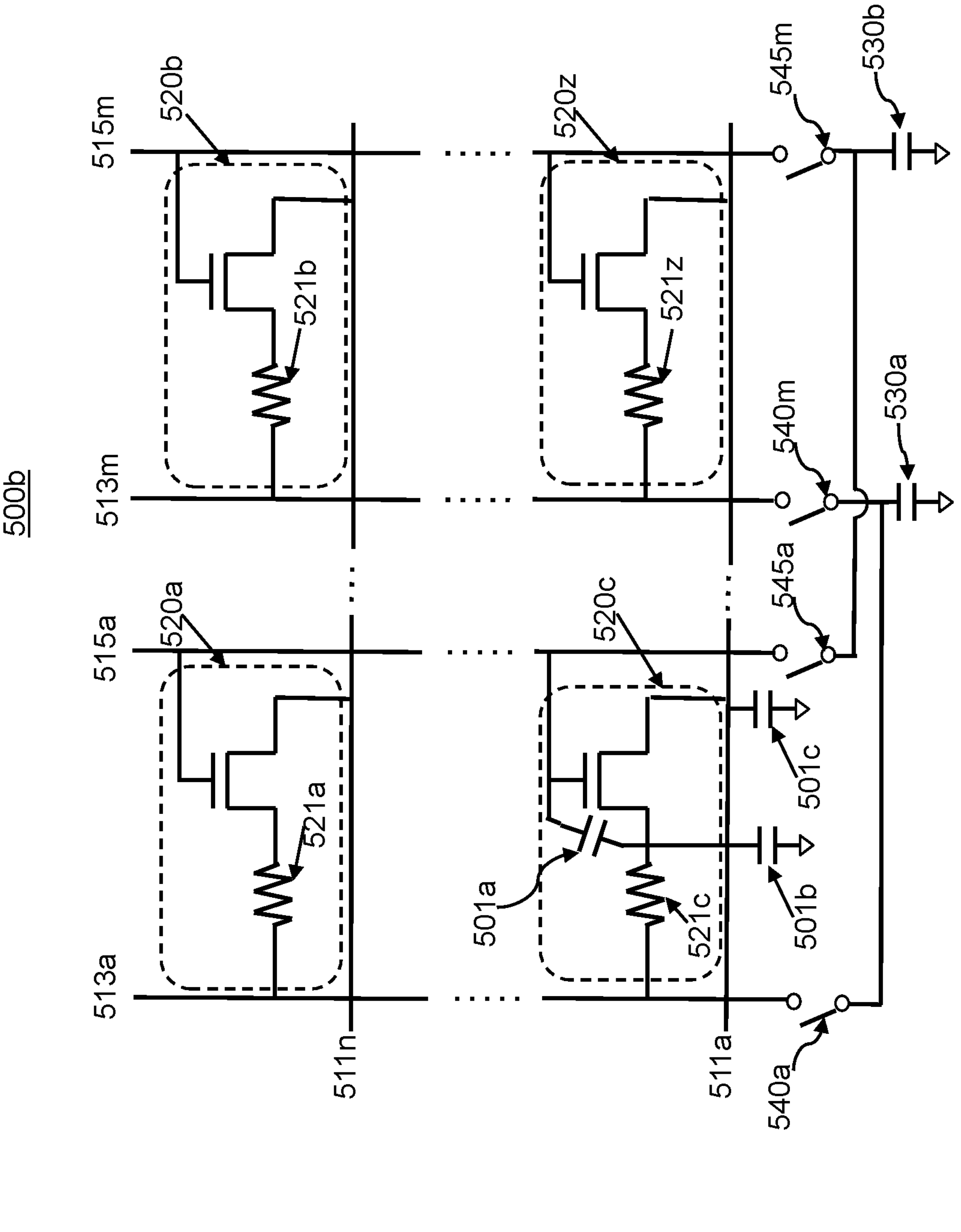

FIGS. 5A and 5B are schematic diagrams illustrating examples 500a and 500b of a crossbar circuit in accordance with some embodiments of the present disclosure. Crossbar circuits 500a and 500b are examples of a portion of crossbar circuit 100 of FIG. 1 in greater detail.

Crossbar circuits 500a-b may include word lines 511a, . . . , 511n, bit lines 513a, . . . , 513m, cross-point devices 520a, 520b, 520c, . . . , 520z, and select lines 515a, . . . , 515m. Word lines 511a-n and bit lines 513a-m may be the same as row lines 111a-n and column lines 113a-m of FIG. 1, respectively. As shown in FIGS. 5A-5B, select lines 515a-m may be parallel to bit lines 513a-m.

As shown, each cross-point device 520a, 520b, . . . , 520z may be connected to a bit line 513a-m, a select line 515a-n, and a word line 511a-n. In some embodiments, each cross-point device 520a-z may include a transistor and an RRAM device (e.g., RRAM devices 521a, 521b, 521c, . . . , 521z) connected in series (e.g., a 1T1R configuration described in connection with FIG. 2A or FIG. 2B).

The crossbar circuit 500a may further include one or more capacitors 530a that are operatively connected to bit lines 513a-m. For example, each bit line 513a, . . . , 513m may be connected to the capacitor 530a via a switch (e.g., a switch 540a, . . . 540m). The capacitance of the capacitor(s) 530a may be significantly greater than the parasitic capacitance of the crossbar circuit 500a-b (e.g., the capacitance of parasitic capacitors 501a, 501b, 501c, etc.).

In some embodiments, as shown in FIG. 5B, the crossbar circuit 500b may include one or more capacitors 530b that are operatively connected to select lines 515a-m. For example, each select line 515a, . . . , 515m may be connected to the capacitor 530b via a switch (e.g., a switch 545a, . . . , 545m). The capacitance of the capacitor(s) 530b may be significantly greater than the parasitic capacitance of the crossbar circuit 500b (e.g., the capacitance of parasitic capacitors 501a, 501b, 501c, etc.).

Prior to a programming operation (e.g., a set operation, a form operation, a reset operation, a deform operation), the capacitor(s) 530a-b may be reset to ground. To initiate a programming operation and/or program a target cross-point device to a target conductance value, the capacitor(s) 530a-b may be connected to a bit line connected to the target cross-point device (also referred to as the "selected bit line") and a select line connected to the target cross-point device, respectively. A first programming voltage and a second programming voltage may then be applied to the selected word line and the selected bit line, respectively. The selected word line and the selected bit line may be brought down to ground at the end of the programming cycle. When the crossbar circuit 500a-b is performing in-memory computing (e.g., performing a VMM operation), the capacitor 530a is disconnected from the bit lines 513a-m. The capacitor 530b is also disconnected from the select lines 515a-m when the crossbar circuit 500b is performing in-memory computing.

Connecting additional capacitors 530a-b to the bit lines and the select lines may slow down the voltage changes on the selected bit line and the selected word line, thereby allowing the voltage on the parasitic capacitors to synchronize with the bit line and word line voltage alterations. As a result, the voltage difference across the unselected RRAM devices may be maintained at a sufficiently low level to prevent unintentional programming of unselected RRAM devices.

As an example, the capacitor(s) 530a-b may be reset to ground prior to performing a programming operation on the cross-point device 520a and/or the RRAM device 521a. The capacitor(s) 530a may then be connected to the bit line 513a via the switch 540a. The capacitor(s) 530b may also be connected to the select line 515a via the switch 545a. A select voltage may be applied to the select line 515a to select the cross-point device 520a and/or the RRAM device 521a for programming. The select lines that are not connected to the cross-point device 520a may be grounded. During a form operation or a set operation, the word line 511n may be grounded. A programming voltage may be applied to the bit line 513a. The bit lines and the word lines that are not connected to the cross-point device 520a (e.g., 513m, 511a, etc.) may be set to float. During a deform operation or reset operation on the cross-point device 520a and/or the RRAM device 521a, a programming voltage may be applied to the word line 511n connected to the cross-point device 520a. The bit line 513a is grounded. The word lines and the bit lines that are not connected to the cross-point device 520a may be set to float. The capacitor(s) 530a-b may slow down the ramping speed of the bit line voltage. As a result, a programming process that programs the cross-point device 520a and/or the RRAM device 521a to a target value does not involve unintentional programming and/or disturbance of unselected RRAM devices (e.g., RRAM device 521c).

Figure 6:
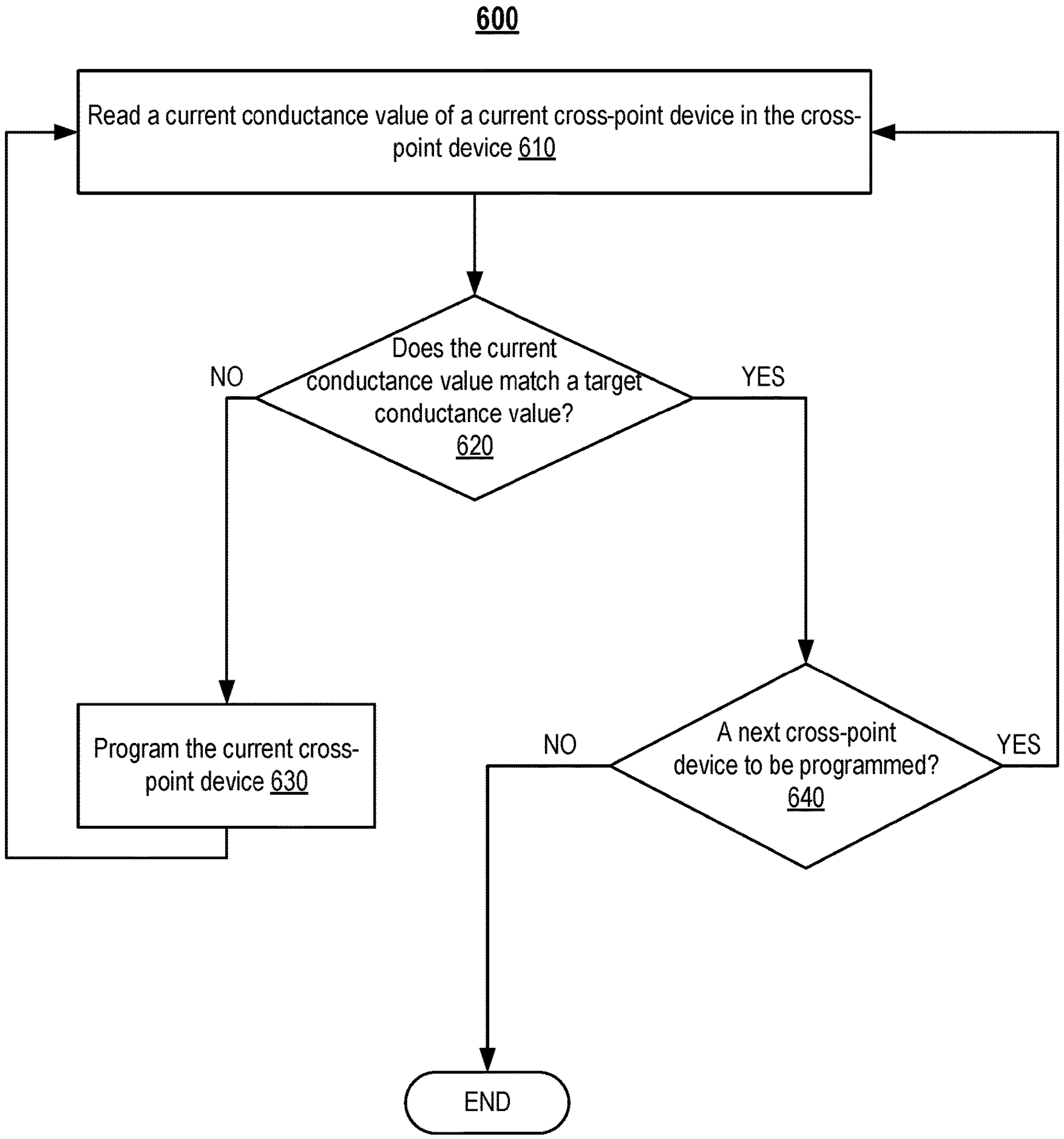
FIG. 6 is a flowchart of an example method for programming a crossbar circuit in accordance with some embodiments of the present disclosure.

FIG. 6 is a flowchart of an example method 600 for programming a crossbar circuit in accordance with some embodiments of the present disclosure. The crossbar circuit may include a plurality of intersecting wires, such as a plurality of bit lines, a plurality of word lines, and a plurality of select lines. The crossbar circuit may further include a plurality of cross-point devices. Each of the cross-point devices is connected to at least one of the word lines, at least one of the bit lines, and at least one of the select lines. The crossbar circuit may be the crossbar circuit 400a-b of FIGS. 4A-4B or the crossbar circuit 500a-b of FIGS. 5A-5B.

At 610, a current conductance value of a current cross-point device in the crossbar circuit may be read using suitable circuitry.

At 620, the current conductance value may be compared to a target conductance value to determine if the current conductance value matches the target conductance value. The current conductance value may be regarded as matching the target conductance value when a difference between the current conductance value and the target conductance value is not greater than a predetermined threshold.

In some embodiments in which the current conductance value does not match the target conductance value ("NO" at 620), the current cross-point device may be programmed based on the comparison result at 630. For example, in some embodiments in which the current conductance value is higher than the target conductance value, a reset operation may be performed on the current cross-point device. As another example, in some embodiments in which the current conductance value is lower than the target conductance value, a set operation may be performed on the current cross-point device. Programming the current cross-point device may involve performing one or more operations as described in FIG. 7 below. Method 600 may loop back to 610 after executing 630. The programming of the current cross-point device may be performed by executing 610, 620, and 630 iteratively until the current conductance value of the current cross-point device matches the target conductance.

In some embodiments in which the current conductance value matches the target conductance value, method 600 may proceed to 640 and may determine if a next cross-point device of the crossbar circuit is to be programmed. If one or more cross-point devices in the crossbar circuit are to be programmed, the next cross-point device may be selected for programming until the conductance of each of the cross-point devices to be programmed reaches its corresponding target value. If the conductance of each of the cross-point devices to be programmed reaches its respective target value, method 600 may conclude.

Figure 7:
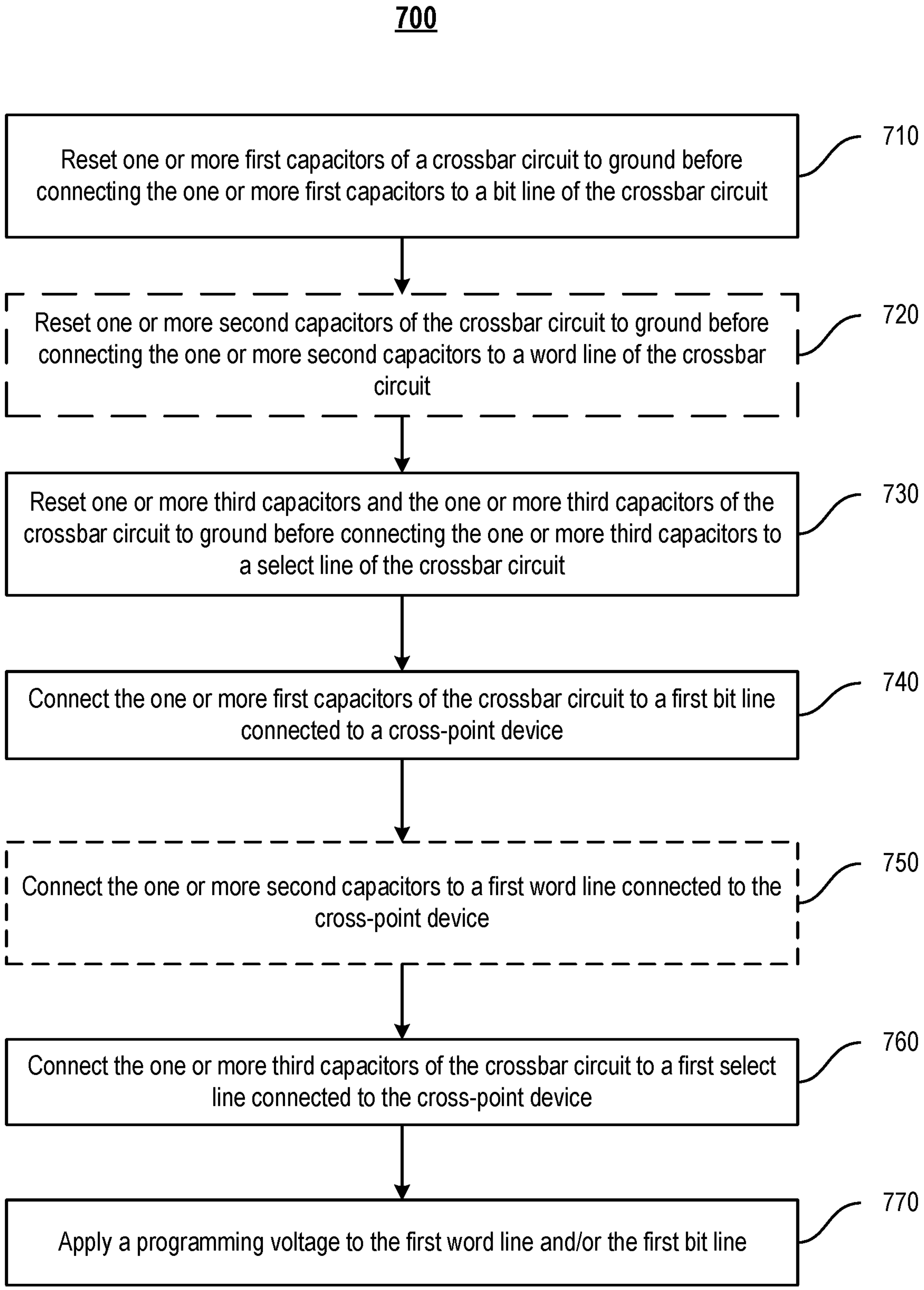
FIG. 7 is a flowchart of an example method for programming a cross-point device in a crossbar circuit in accordance with some embodiments of the present disclosure.

FIG. 7 is a flowchart of an example method 700 for programming a crossbar circuit in accordance with some embodiments of the present disclosure. The crossbar circuit may include a plurality of bit lines intersecting with a plurality of word lines and a plurality of cross-point devices. Each of the plurality of the cross-point devices is connected to at least one of the word lines and at least one of the bit lines. The crossbar circuit may be the crossbar circuits 400*a-b* of FIGS. 4A-4B or the crossbar circuit 500*a-b* of FIGS. 5A-5B. Method 700 may be performed to program a first cross-point device of the crossbar circuit to a target conductance value without disturbing another cross-point device of the crossbar circuit that is not selected for programming. The first cross-point device (e.g., cross-point device 420*a* of FIGS. 4A-4B or cross-point device 520*a* of FIGS. 5A-5B) may include a first RRAM device (e.g., RRAM device 421*a* of FIGS. 4A-4B or RRAM device 521*a* of FIGS. 5A-5B). The first cross-point device may be connected to a first bit line, a first word line, and a first select line of the crossbar circuit.

Method 700 may start at 710, when one or more first capacitors of the crossbar circuit may be reset to ground. The first capacitor(s) may be operatively connected to each of a plurality of bit lines of the crossbar circuit. The first capacitor(s) may be the capacitor(s) 430*a* of FIGS. 4A-4B or the capacitor(s) 530*a* of FIGS. 5A-5B.

At 720, one or more second capacitors of the crossbar circuit may be reset to ground. The second capacitor(s) may be operatively connected to each of a plurality of word lines of the crossbar circuit. The second capacitor(s) may be, for example, the capacitor(s) 430*b* of FIGS. 4A-4B.

At 730, one or more third capacitors of the crossbar circuit may be reset to ground. The third capacitor(s) may be operatively connected to each of a plurality of select lines of the crossbar circuit. The third capacitor(s) may be, for example, the capacitor(s) 430*c* of FIG. 4B or capacitor(s) 530*b* of FIG. 5B.

At 740, the one or more first capacitors may be connected to the first bit line. For example, the first capacitor(s) may be connected to the first bit line via a switch (e.g., switch 440*a-m* of FIGS. 4A-4B or switch 540*a-m* of FIGS. 5A-5B).

At 750, the one or more second capacitors may be connected to the first word line. For example, the second capacitor(s) may be connected to the first word line via a switch (e.g., switch 450*a-n* of FIGS. 4A-4B). In some embodiments in which the crossbar circuit comprises select lines parallel to the bit lines (e.g., the crossbar circuit 500*a-b* of FIGS. 5A-5B), 720 and 740 may be omitted.

At 760, the one or more third capacitors may be connected to the first select line. For example, the third capacitor(s) may be connected to the first select line via a switch (e.g., switch 460*a-n* of FIG. 4B, switch 545*a-m* of FIG. 5B).

At 770, a programming voltage may be applied to the first word line and/or the first bit line to program the first cross-point device to a target conductance. For example, during a form operation or a set operation, the programming voltage is applied to the first bit line. The first word line is grounded. One or more other word lines (e.g., a second word line) that are not connected to the first cross-point device may be set to float. The conductance values of the cross-point devices that are not selected for programming are not disturbed. For example, the conductance of a second cross-point device connected to the second word line and the first bit line is not disturbed even though the second cross-point device and the first cross-point device share the same bit line.

As another example, during a deform operation or a reset operation, the programming voltage may be applied to the first word line. The first bit line may be grounded. One or more other bit lines that are not connected to the first cross-point device are set to float. The conductance values of the cross-point devices that are not selected for programming are not disturbed. For example, the conductance of a third cross-point device connected to the first word line and the second bit line is not disturbed.

The terms "approximately," "about," and "substantially" as used herein may mean within a range of normal tolerance in the art, such as within 2 standard deviations of the mean, within ±20% of a target dimension in some embodiments, within ±10% of a target dimension in some embodiments, within ±5% of a target dimension in some embodiments, within ±2% of a target dimension in some embodiments, within ±1% of a target dimension in some embodiments, and yet within ±0.1% of a target dimension in some embodiments. The terms "approximately" and "about" may include the target dimension. Unless specifically stated or obvious from context, all numerical values described herein are modified by the term "about."

As used herein, a range includes all the values within the range. For example, a range of 1 to 10 may include any number, combination of numbers, sub-range from the numbers of 1, 2, 3, 4, 5, 6, 7, 8, 9, and 10 and fractions thereof.

In the foregoing description, numerous details are set forth. It will be apparent, however, that the disclosure may be practiced without these specific details. In some instances, well-known structures and devices are shown in block diagram form, rather than in detail, in order to avoid obscuring the disclosure.

The terms "first," "second," "third," "fourth," etc. as used herein are meant as labels to distinguish among different elements and may not necessarily have an ordinal meaning according to their numerical designation.

The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or". That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Reference throughout this specification to "an implementation" or "one implementation" means that a particular feature, structure, or characteristic described in connection with the implementation is included in at least one implementation. Thus, the appearances of the phrase "an implementation" or "one implementation" in various places throughout this specification are not necessarily all referring to the same implementation.

As used herein, when an element or layer is referred to as being "on" another element or layer, the element or layer may be directly on the other element or layer, or intervening elements or layers may be present. In contrast, when an element or layer is referred to as being "directly on" another element or layer, there are no intervening elements or layers present.

Whereas many alterations and modifications of the disclosure will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims, which in themselves recite only those features regarded as the disclosure.

What is claimed is:

1. An apparatus, comprising:

a plurality of bit lines intersecting with a plurality of word lines;

a plurality of cross-point devices, wherein each of the plurality of cross-point devices is connected to at least one of the plurality of word lines and at least one of the plurality of bit lines, wherein a first cross-point device of the plurality of cross-point devices is connected to a first word line and a first bit line;

one or more first capacitors;

a first plurality of switches configured to connect the one or more first capacitors to the plurality of bit lines;

one or more second capacitors; and a second plurality of switches configured to connect the one or more second capacitors to the plurality of word lines, wherein the second plurality of switches is configured to connect the one or more second capacitors to the first word line prior to an application of a programming voltage to the first word line or the first bit line.

2. The apparatus of claim 1, wherein the one or more first capacitors are operatively connected to each of the plurality of bit lines via a respective switch of the first plurality of switches.

3. The apparatus of claim 1, wherein the plurality of cross-point devices comprises at least one of a memristor, a phase-change memory (PCM) device, a floating gate device, a spintronic device, a ferroelectric device, or a resistive random-access memory (RRAM) device.

4. The apparatus of claim 1, further comprising a plurality of select lines connected to the plurality of cross-point devices, wherein the plurality of cross-point devices comprises at least one transistor that connects to at least one of the plurality of select lines.

5. The apparatus of claim 4, further comprising one or more third capacitors operatively connected to the plurality of select lines.

6. The apparatus of claim 5, further comprising a third plurality of switches, wherein the one or more third capacitors are connected to each of the plurality of select lines or reset to ground via a respective switch of the third plurality of switches.

7. The apparatus of claim 1, wherein the first plurality of switches is configured to connect the one or more first capacitors to the first bit line prior to the application of a programming voltage to the first word line or the first bit line.

8. The apparatus of claim 7, wherein the first plurality of switches is further configured to disconnect the one or more first capacitors from the first bit line during an in-memory computing operation performed by the apparatus using the first cross-point device.

9. The apparatus of claim 1, wherein the second plurality of switches is further configured to disconnect the one or more second capacitors from the first word line during an in-memory computing operation performed by the apparatus using the first cross-point device.

10. A method for programming a crossbar circuit, comprising:

connecting one or more first capacitors of the crossbar circuit to a first bit line of a plurality of bit lines;

applying a programming voltage to a first word line of a plurality of word lines or the first bit line, wherein the plurality of bit lines intersect with the plurality of word lines, wherein the crossbar circuit comprises a plurality of cross-point devices, wherein each of the plurality of cross-point devices is connected to at least one of the word lines and at least one of the bit lines, and wherein a first cross-point device of the plurality of cross-point devices is connected to the first word line and the first bit line; and connecting one or more second capacitors of the crossbar circuit to the first word line of the crossbar circuit prior to the application of the programming voltage to the first word line or the first bit line.

11. The method of claim 10, further comprising:

resetting the one or more first capacitors of the crossbar circuit to ground before connecting the one or more first capacitors to the first bit line of the crossbar circuit.

12. The method of claim 10, further comprising:

resetting the one or more second capacitors of the crossbar circuit to ground before connecting the one or more second capacitors to the first word line of the crossbar circuit.

13. The method of claim 10, further comprising:

connecting one or more third capacitors of the crossbar circuit to a first select line of the crossbar circuit prior to the application of the programming voltage to the first word line or the first bit line.

14. The method of claim 13, further comprising:

resetting the one or more third capacitors of the crossbar circuit to ground before connecting the one or more third capacitors to the first select line of the crossbar circuit.

15. The method of claim 14, further comprising:

applying a select voltage to the first select line connected to the first cross-point device.

16. The method of claim 15, wherein the programming voltage is applied to the first word line, wherein the first bit line is grounded, wherein a second bit line of the crossbar circuit is set to float, and wherein a second cross-point device of the crossbar circuit is connected to the first word line, the second bit line, and the first select line.

17. The method of claim 15, wherein the programming voltage is applied to the first bit line, wherein the first word line is grounded, wherein a second word line is set to float, and wherein a third cross-point device of the crossbar circuit is connected to the second word line, the first bit line, and a second select line.

18. A method for programming a crossbar circuit, comprising:

connecting one or more first capacitors of the crossbar circuit to a first bit line of a plurality of bit lines;

applying a programming voltage to a first word line of a plurality of word lines or the first bit line, wherein the plurality of bit lines intersect with the plurality of word lines, wherein the crossbar circuit comprises a plurality of cross-point devices, wherein each of the plurality of cross-point devices is connected to at least one of the word lines and at least one of the bit lines, and wherein a first cross-point device of the plurality of cross-point devices is connected to the first word line and the first bit line; and connecting one or more third capacitors of the crossbar circuit to a select line of the crossbar circuit prior to the application of the programming voltage to the first word line or the first bit line.

19. The method of claim 18, further comprising:

resetting the one or more third capacitors of the crossbar circuit to ground before connecting the one or more third capacitors to the select line of the crossbar circuit.

* * * * *